(12) United States Patent
Jang et al.

(10) Patent No.: US 7,659,784 B2
(45) Date of Patent: Feb. 9, 2010

(54) INJECTION-LOCKED FREQUENCY DIVIDER

(75) Inventors: Sheng-Lyang Jang, Taipei (TW); Cheng-Chen Liu, Taipei County (TW)

(73) Assignee: National Taiwan University of Science and Technology, Taipei (TW)

( * ) Notice: Subject to any disclaimer, the term of this patent is extended or adjusted under 35 U.S.C. 154(b) by 76 days.

(21) Appl. No.: 11/965,745

(22) Filed: Dec. 28, 2007

(65) Prior Publication Data

US 2009/0102565 A1    Apr. 23, 2009

(30) Foreign Application Priority Data

Oct. 18, 2007    (TW) .............................. 96138997 A

(51) Int. Cl.
*H03B 21/00*    (2006.01)
(52) U.S. Cl. .................... 331/40; 331/117 R; 331/132; 331/167; 445/302; 445/313; 445/323; 445/340
(58) Field of Classification Search .................. 331/40, 331/117 R, 132, 167; 455/302, 313, 323, 455/340; 454/302, 313, 323, 340
See application file for complete search history.

(56) References Cited

U.S. PATENT DOCUMENTS

| | | | | |
|---|---|---|---|---|
| 5,396,195 | A * | 3/1995 | Gabara | ................... 331/113 R |
| 6,317,008 | B1 * | 11/2001 | Gabara | ................... 331/117 R |
| 6,559,725 | B1 | 5/2003 | Akiya | |
| 6,864,728 | B1 * | 3/2005 | Lu | ............................ 327/122 |
| 6,911,870 | B2 * | 6/2005 | Gierkink et al. | ................ 331/46 |
| 6,959,178 | B2 * | 10/2005 | Macedo et al. | ............... 455/313 |
| 7,123,112 | B2 * | 10/2006 | Kang et al. | ............ 331/117 FE |
| 7,173,500 | B2 * | 2/2007 | Komori | ...................... 331/167 |
| 7,415,257 | B2 * | 8/2008 | Chou et al. | .................. 455/130 |
| 2003/0043950 | A1 | 3/2003 | Hansen et al. | |
| 2003/0064698 | A1 * | 4/2003 | Kim et al. | .................... 455/313 |
| 2007/0058753 | A1 * | 3/2007 | Saavedra et al. | ............ 375/329 |

FOREIGN PATENT DOCUMENTS

| | | |
|---|---|---|
| JP | 2006129330 | 5/2006 |
| TW | 200620833 | 6/2006 |

\* cited by examiner

*Primary Examiner*—Arnold Kinkead
*Assistant Examiner*—Richard Tan
(74) *Attorney, Agent, or Firm*—Jianq Chyun IP Office

(57) ABSTRACT

An injection-locked frequency divider is provided. The injection-locked frequency divider includes a voltage control oscillator (VCO) and a mixer. The VCO includes a LC resonance tank and a negative-resistance generator for generating a differential oscillation signal including a first and a second oscillation signals. The LC resonance tank adjusts a VCO reactance and resonates for generating the differential oscillation signal. The negative-resistance generator coupled to the LC resonance tank eliminates an equivalent resistance generated by the LC resonance tank and maintains the VCO to continuously oscillate. The mixer has a first and a second local input terminals respectively receiving the first and second injected signals included in a differential injected signal, and the first and second radio frequency input terminals respectively receiving the first and second oscillation signals for mixing the differential injected signal with the differential oscillation signal to adjust the output frequency of the differential oscillation signal.

16 Claims, 4 Drawing Sheets

INJECTION-LOCKED FREQUENCY DIVIDER

CROSS-REFERENCE TO RELATED APPLICATION

This application claims the priority benefit of Taiwan application serial no. 96138997, filed on Oct. 18, 2007. The entirety of the above-mentioned patent application is hereby incorporated by reference herein and made a part of this specification.

BACKGROUND OF THE INVENTION

1. Field of the Invention

The present invention generally relates to an injection-locked frequency divider, and more particularly, to an injection-locked frequency divider, based on a mixer and a voltage control oscillator, having a wide injection-locking range and a low phase noise.

2. Description of Related Art

The rapid development of wireless communication, not only drastically improves quality of human life, but also brings huge economic profit. Up to now, one may instantly communicate and share information with others simply by a notebook, a personal digital assistant, or a cellular phone. In a typical wireless communication system, a frequency synthesizer is a critical component for generating carrier wave signals. The frequency synthesizer usually includes a frequency divider for dividing a frequency of an input signal, so as to generate a signal with desired frequency. Such frequency dividers are also widely used in multiplexers, phase locked loops, and clock pulse generators.

Frequency dividers are often classified into digital frequency dividers and analog frequency dividers. Digital frequency dividers include common mode logic frequency dividers and dynamic logic frequency dividers. Analog frequency dividers include Miller dividers and injection-locked frequency dividers. Typically, a frequency divider often consumes much power when operating under a high frequency, so as to decrease the operation efficiency of the system. Comparatively, an injection-locked frequency divider, in an RF communication system, usually having a higher operation frequency and lower power consumption than other frequency dividers, is often selected.

FIG. 1 is a circuit diagram illustrating a conventional injection-locked frequency divider. Referring to FIG. 1, there is shown a conventional injection-locked frequency divider 100 including a signal injection unit 110, and an LC resonance tank 120. The signal injection unit 110 includes a P type transistor P1, for receiving an injection signal Vinj having a frequency fi. The LC resonance tank 120 includes the inductances I1, I2, and the variable capacitors Cf1, Cf2. In the injection-locked frequency divider 100, a signal Vtune is introduced to control voltage differences over the variable capacitors Cf1 and Cf2, so as to adjust an oscillation frequency fo of a frequency dividing signal S1. When the oscillation frequency fo approximates to a half of the frequency fi of the injection signal Vinj, the injection-locked frequency divider 100 locks and outputs the frequency dividing signal S1 with a frequency of fi/2 via nodes A and B. The injection-locked frequency divider 100 further includes P type transistors P2 and P3. The P type transistors P2 and P3 are cross coupled to generate a negative resistance for eliminating an equivalent resistance generated by the LC resonance tank 120.

However, when the oscillation frequency fo is too much different from a half of the injection signal (fi/2), the injection-locked frequency divider 100 is then incapable of locking the frequency of the frequency dividing signal S1. Generally, a ratio LR of a locking range is used for describing that a highest frequency $f_{IH}$ that can be locked minus a lowest frequency $f_{IL}$ that can be locked, and then is divided by two times of the oscillation frequency fo of the LC resonance tank 120, which can be represented by an equation as LR=($f_{IH}$−$f_{IL}$)/(2×fo). Although the conventional injection-locked frequency divider 100 is adapted for operation under a very high frequency, unfortunately its locking range is too narrow, so that the injection-locked frequency divider 100 has too narrow a range for frequency dividing. Even though the variable capacitors Cf1, Cf2 are employed for adjusting the oscillation frequency, the locking range can not be effectively improved.

As such, to further modify the conventional injection-locked frequency divider and providing a solution of the narrow locking range thereof become an important concern of the research of injection-locked frequency dividers.

SUMMARY OF THE INVENTION

Accordingly, the present invention is directed to an injection-locked frequency divider, which employs a voltage control oscillator (VCO) to generate an oscillation signal, and a mixer mixing the oscillation signal with an injection signal, so as to adjust and lock a frequency of the oscillation signal. The injection-locked frequency divider has advantages such as a wide locking range, and a low phase noise.

The present invention provides an injection-locked frequency divider. The injection-locked frequency divider includes a voltage control oscillator (VCO), and a mixer. The VCO includes an LC resonance tank and a negative resistance generator, for generating a differential oscillation signal including a first and a second oscillation signals. The LC resonance tank includes a first connection terminal and a second connection terminal, for adjusting a reactance thereof and resonating for generate the differential oscillation signal. The LC resonance tank outputs the first and the second oscillation signals respectively from the first and the second connection terminals. The negative resistance generator is coupled to the first and the second connection terminals, for eliminating an equivalent resistance generated by the LC resonance tank and maintaining the VCO to oscillate continuously. The mixer is coupled to the VCO, including a first and a second local input terminals respectively receiving a first and a second injection signals included in a differential injection signal, and a first and a second RF input terminals receiving the first and the second oscillation signals respectively, for mixing the differential signal with the differential oscillation signal, and thus adjusting and locking an output frequency of the differential oscillation signal.

According to an embodiment of the present invention, the foregoing LC resonance tank of the injection-locked frequency divider includes a first inductance and a second inductance, and a first variable capacitor and a second variable capacitor. The first inductance has a first terminal serving as the first connection terminal. The second inductance has a first terminal coupled to a second terminal of the first inductance, and a second terminal serving as the second connection terminal of the LC resonance tank. The first variable capacitor has a first terminal coupled to the first terminal of the first inductance, and a second terminal receiving a reactance control signal. The second variable capacitor has a first terminal coupled to the second terminal of the first variable capacitor, and a second terminal coupled to the second terminal of the second inductance. The LC resonance tank controls a reactance value thereof according to the reactance control signal.

According to an embodiment of the present invention, the foregoing LC resonance tank of the injection-locked frequency divider includes a first inductance and a second inductance, and a first variable capacitor and a second variable capacitor. The first inductance has a first terminal serving as the first connection terminal, and a second terminal coupled to a first voltage. The second inductance has a first terminal serving as the second connection terminal of the LC resonance tank, and a second terminal coupled to the first voltage. The first variable capacitor has a first terminal coupled to the first terminal of the first inductance, and a second terminal receiving a reactance control signal. The second variable capacitor has a first terminal coupled to a second terminal of the first variable capacitor, and a second terminal coupled to the first terminal of the second inductance. The LC resonance tank controls a reactance value thereof according to the reactance control signal.

According to an embodiment of the present invention, the foregoing mixer of the injection-locked frequency divider includes a first through sixth transistors. The first transistor has a gate receiving the first injection signal, a first source/drain coupled to the second connection terminal of the LC resonance tank. The second transistor has a gate and a first source/drain respectively coupled to the gate of the first transistor and the first connection terminal of the LC resonance tank. The third transistor has a gate receiving the second injection signal, a first source/drain and a second source/drain respectively coupled to the first connection terminal of the LC resonance tank and a second source/drain of the first transistor. The fourth transistor has a gate, a first source/drain and a second source/drain respectively coupled to the gate of the third transistor, the second connection terminal of the LC resonance, and a second source/drain of the second transistor. The fifth transistor has a gate receiving the first oscillation signal, and a first source/drain and a second source/drain respectively coupled to the second source/drain of the first transistor and the first voltage. The sixth transistor has a gate receiving the second oscillation signal, and a first source/drain and a second source/drain respectively coupled to the second source/drain of the second transistor and the first voltage. The gates of the first and the third transistors respectively serve as the first and second local input terminals, and the gates of the fifth and the sixth transistors respectively serve as the first and second RF input terminals.

According to an embodiment of the present invention, the foregoing negative resistance generator of the injection-locked frequency divider includes a first and a second switches. The first switch has a first terminal, a second terminal and a controller terminal, respectively coupled to the first voltage, the first connection terminal of the LC resonance tank, and the second connection terminal of the LC resonance tank. The second switch has a first terminal, a second terminal and a controller terminal, respectively coupled to the first voltage, the second connection terminal of the LC resonance tank, and the first connection terminal of the LC resonance tank.

The injection-locked frequency divider according to the present invention feedbacks a oscillation signal generated by a VCO to an RF input terminal of a mixer, so as to mix the oscillation signal with an injection signal of a local input terminal of the mixer, and thus adjusting and locking the output frequency of the oscillation signal. In such a way, the locking range of the injection-locked frequency divider can be enlarged, and the phase noise thereof can be decreased accordingly.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
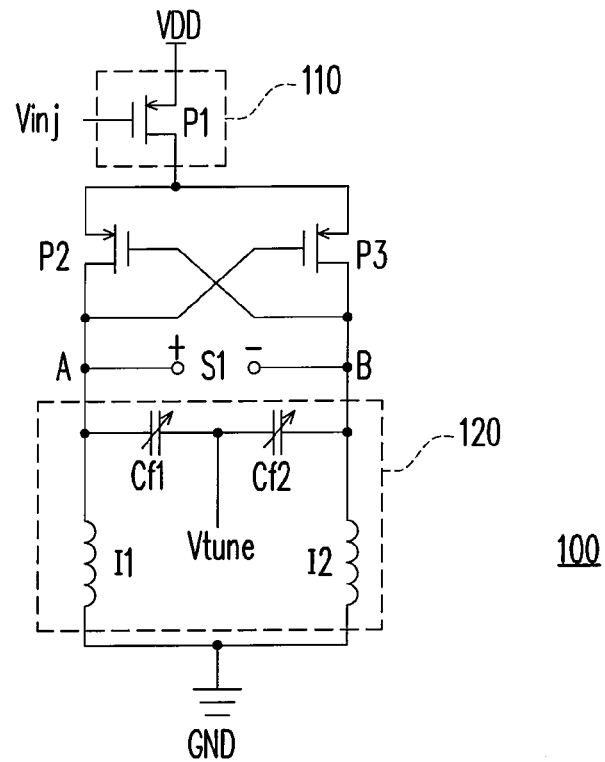
FIG. 1 is a circuit diagram illustrating a conventional injection-locked frequency divider.

Reference will now be made in detail to the present preferred embodiments of the invention, examples of which are illustrated in the accompanying drawings. Wherever possible, the same reference numbers are used in the drawings and the description to refer to the same or similar parts.

Figure 2:
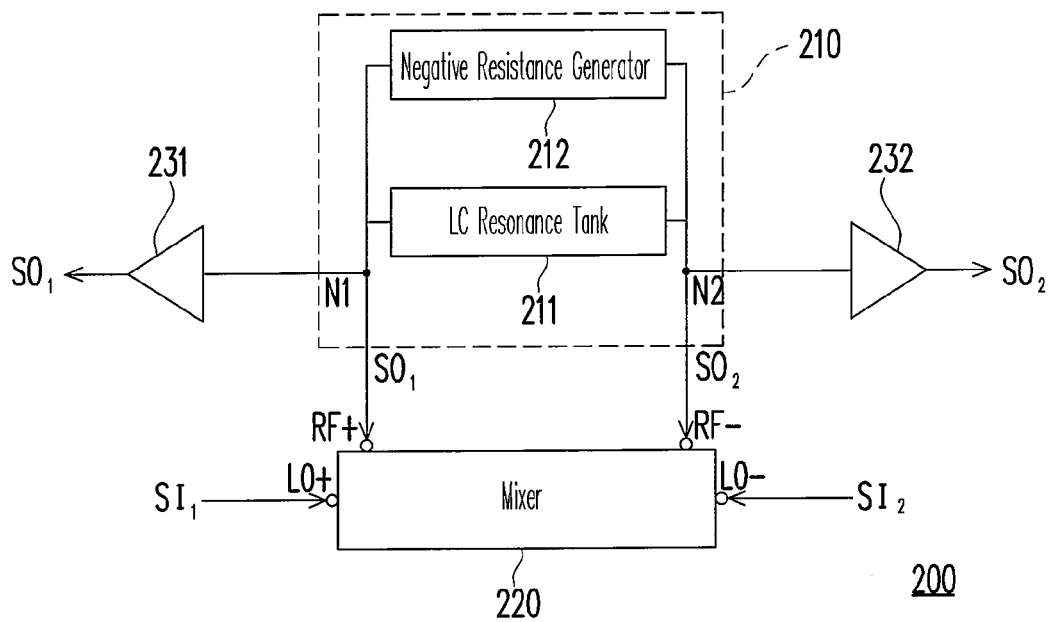
FIG. 2 illustrates a structural diagram of an injection-locked frequency divider according to an embodiment of the present invention.

FIG. 2 illustrates a structural diagram of an injection-locked frequency divider according to an embodiment of the present invention. Referring to FIG. 2, there is shown an injection-locked frequency divider 200 including a voltage control oscillator (VCO) 210, a mixer 220, and buffers 231 and 232. The VCO 210 includes an LC resonance tank 211, and a negative resistance generator 212. The VCO 210 generates a differential oscillation signal SO via a resonance of the LC resonance tank 211. The differential oscillation signal SO includes a first oscillation signal $SO_1$, and a second oscillation signal $SO_2$. The first oscillation signal $SO_1$ and the second oscillation signal $SO_2$ are respectively outputted from a first connection terminal N1 and a second connection terminal N2 of the LC resonance tank 211 to a first and a second ratio frequency (RF) input terminals RF+, RF− of the mixer 220. The mixer 220 includes a first and a second local input terminals LO+, LO−, respectively for receiving a first and a second injection signals $SI_1$, $SI_2$ included in a differential injection signal SI. The mixer 220 mixes the differential injection signal SI with the differential oscillation signal SO, to adjust and lock an output frequency of the differential oscillation signal SO. According to an embodiment of the present invention, the differential injection signal SI is generated by another local VCO.

The buffers 231 and 232 are respectively coupled to the first and the second connection terminals N1 and N2 of the LC resonance tank 211. When the injection-locked frequency divider 200 locks and outputs the first and the second oscillation signals $SO_1$ and $SO_2$, the buffers 231 and 232 can be used for increasing signal transmission intensity of the first and the second oscillation signals $SO_1$ and $SO_2$, and transmitting the same.

Figure 3:
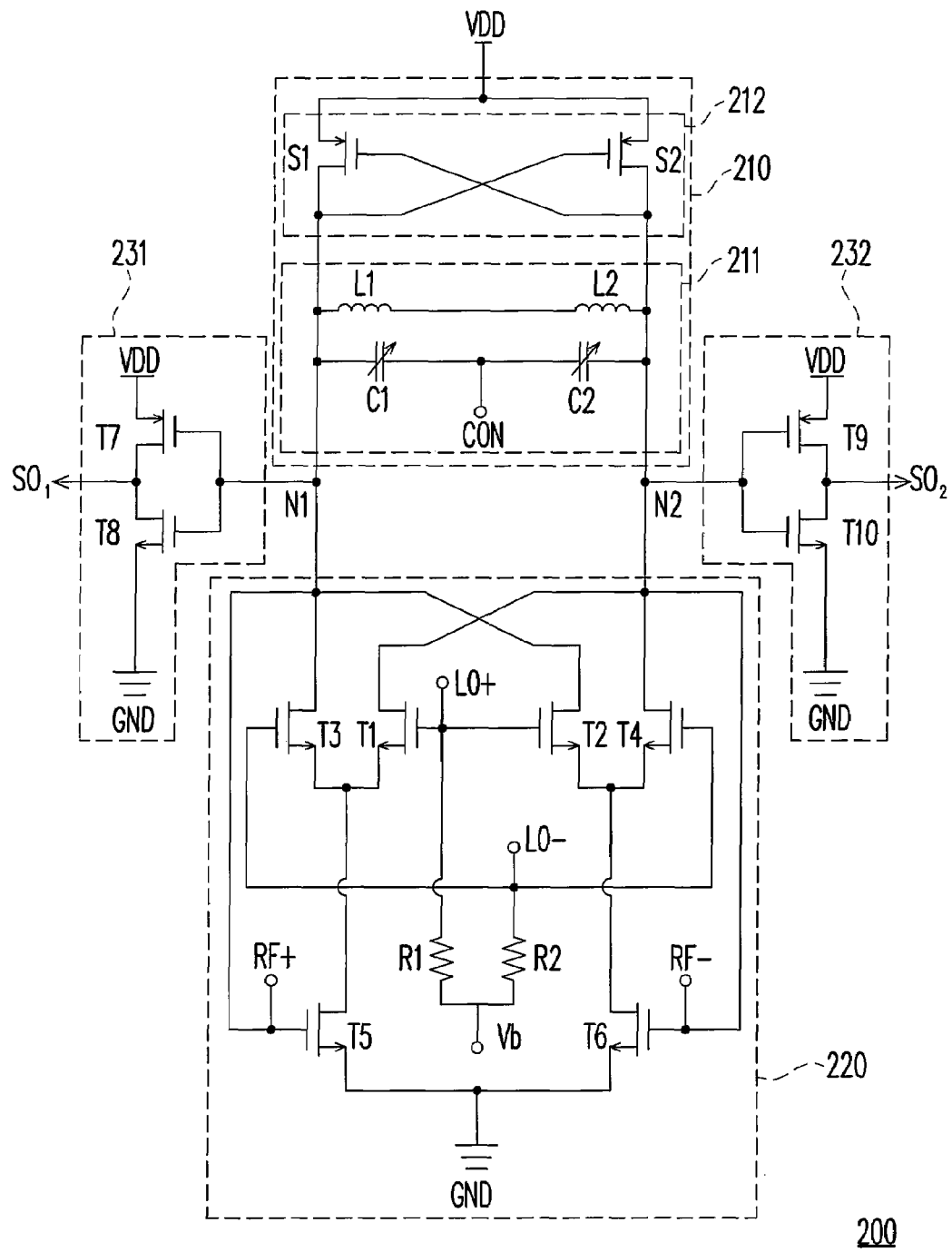
FIG. 3 is a circuit diagram illustrating the injection-locked frequency divider of FIG. 2.

FIG. 3 is a circuit diagram illustrating the injection-locked frequency divider of FIG. 2. Referring to FIG. 3, the VCO 210 includes an LC resonance tank 211 and a negative resistance generator 212. The LC resonance tank 211 includes the inductances L1 and L2, and the variable capacitors C1 and C2. The inductance L1 has a first terminal serving as a first connection terminal N1 of the LC resonance tank 211, and a second terminal coupled to a first terminal of the inductance L2. The inductance L2 has a second terminal serving as a second connection terminal N2 of the LC resonance tank 211. The variable capacitor C1 has a first terminal coupled to the first terminal of the inductance L1, and a second terminal receiving a reactance control signal CON. The variable capacitor C2 has a first terminal coupled to the second terminal of the variable capacitor C1, and a second terminal coupled to the second terminal of the inductance L2. The LC resonance tank 211 resonates according to the mutual operation of the inductances L1 and L2 and the variable capacitors C1 and C2, and generates the differential oscillation signal SO. The LC resonance tank 211 adjusts a reactance value of the differential oscillation signal SO via the reactance control signal CON, and thus adjusting the oscillation frequency of the differential oscillation signal SO.

As shown in FIG. 3, the negative resistance generator 212 includes switches S1 and S2. According to an embodiment of the invention, the switches S1 and S2 are implemented by P type transistors. The switch S1 has a first terminal, a second terminal and a control terminal respectively coupled to a first voltage, e.g., a power source voltage VDD, the first and second connection terminals N1 and N2 of the LC resonance tank 211. The switch S2 has a first terminal, a second terminal, and a control terminal, respectively coupled to the first voltage, the second and first connection terminals N2 and N1 of the LC resonance tank 211. The switches S1 and S2 implemented by P type transistors are cross coupled within the negative resistance generator 212 so that the negative resistance generator 212 generates a negative resistance to eliminate an equivalent resistance generated by the LC resonance tank 211 and maintains the VCO 210 continuously oscillating.

As shown in FIG. 3, according to an aspect of the embodiment, the mixer 220 of the embodiment is a Gilbert cell mixer, which is adapted for effectively depressing the generation of even harmonics waves, by which dominant frequency signals can have better quality, and phase noises of the injection-locked frequency divider 200 can be decreased. However, the present invention is not restricted by the use of Gilbert mixer, while other kinds of mixers can also be selected. The mixer 220 includes transistors T1 through T6 and resistors R1 and R2. The transistors T1 through T6 are N type transistors. The transistor T1 has a gate serving as the first local input terminal LO+ of the mixer 220 and receiving the first injection signal $SI_1$, and has a first source/drain coupled to the second connection terminal N2 of the LC resonance tank 211. The transistor T2 has a gate and a first source/drain respectively coupled to the gate of the transistor T1 and the first connection terminal N1 of the LC resonance tank 211.

The transistor T3 has a gate serving as the second local input terminal LO− of the mixer 220 and receiving the second injection signal $SI_2$. The transistor T3 also has a first source/drain and a second source/drain respectively coupled to the first connection terminal N1 of the LC resonance tank 211 and the second source/drain of the transistor T1. The transistor T4 has a gate, a first source/drain and a second source/drain, respectively coupled to the gate of the transistor T3, the second connection terminal N2 of the LC resonance tank 211, and the second source/drain of the transistor T2. The transistor T5 has a gate serving as a first RF input terminal RF+ and receiving the first oscillation signal $SO_1$, a first and a second source/drains respectively coupled to the second source/drain of the transistor T1 and a second voltage, e.g., a ground voltage GND. The transistor T6 has a gate serving as a second RF input terminal RF− and receiving the second oscillation signal $SO_2$, and has a first source/drain and a second source/drain coupled respectively to the second source/drain of the transistor T2 and the second voltage. The resistor R1 has a first terminal and a second terminal respectively coupled to the gate of the transistor T1 and a bias voltage Vb. The resistor R2 has a first terminal and a second terminal coupled respectively to the gate of the transistor T3 and the bias voltage Vb.

The mixer 220 mainly includes two stages, i.e., transconductance stage and switch stage. The transconductance stage is composed of the transistors T5 and T6, and is adapted to transform the differential oscillation signal SO from a voltage signal to a current signal. The transistors T5 and T6 also have functions of limiting current. Then the transformed differential oscillation signal SO is inputted to the switch stage composed of the transistors T1 through T4, in which current is switched to mix the differential oscillation signal SO with the differential injection signal SI. The transistors T1 and T3 compose of a differential pair, and the transistors T2 and T4 compose of another differential pair. The VCO 210 is coupled to the mixer 220 serving as a load stage of the mixer 220. The VCO 210 is adapted to convert the mixed signals into voltage signals and then outputs the first and second oscillation signals $SO_1$ and $SO_2$ respectively from the buffers 231 and 232.

According to an embodiment of the present invention, the buffers 231 and 232 implemented by inverters. The buffer 231 is composed of the transistors T7 and T8, while the buffer 232 is composed of the transistors T9 and T10. According to an aspect of the embodiment, the transistors T7 and T9 are P type transistors, and the transistors T8 and T10 are N type transistors.

When the injection-locked frequency divider 200 according to the embodiment of the present invention is operated at a high frequency, the transistors T1 through T6 of the mixer 220 cause a parasitic capacitor effect. In such a way, after being mixed, the high frequency signals are filtered thereby while the low frequency signals are retained, by which the frequency is divided. The injection-locked frequency divider 200 according to the present invention accomplish a ½ frequency divider in this manner, in which a differential oscillation signal SO generated by a self-oscillation of the VCO 210 is mixed with an externally inputted differential injection signal SI. When a frequency of the differential oscillation signal SO approximates a half of a frequency of the differential injection signal SI, the injection-locked frequency divider 200 locks and outputs the differential oscillation signal SO. In such a way, the injection-locked frequency divider 200 according to the embodiment of the present invention receiving the differential injection signals SI via the mixer 220, not only increases the locking range, but also decreases the phase noise. Further the injection-locked frequency divider 200 mixes the differential oscillation signal SO with the differential injection signal SI via the mixer 220, so as to obtain a differential oscillation signal SO which frequency is a half of the frequency of the differential injection signal SI.

It should be noted that the injection-locked frequency divider 200 can be modified in accordance with the practical application within the scope of the present invention. For example, one of ordinary skill in the art may modify the switches S1 and S2 which are complied with P type transistors of the VCO 210 by substituting the P type transistors with N type transistors, or otherwise replacing the transistors T1 through T6 of the mixer with P type transistors.

Figure 4A:
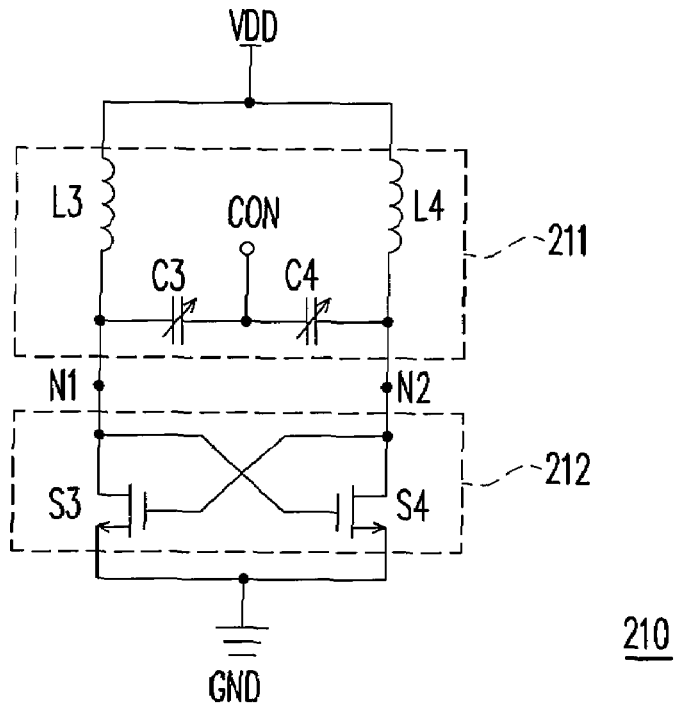
FIG. 4A is a circuit diagram illustrating a VCO of the injection-locked frequency divider of FIG. 2 according to an embodiment of the present invention.

FIG. 4A is a circuit diagram illustrating a VCO of the injection-locked frequency divider of FIG. 2 according to an embodiment of the present invention. Referring to FIG. 4A, the VCO 210 includes an LC oscillation tank 211 and a negative resistance generator 212. The LC resonance tank 211 includes the inductances L3 through L4, and the variable capacitors C3 through C4. The inductance L3 has a first terminal serving as the first connection terminal N1 of the LC resonance tank 211, and a second terminal coupled to a first voltage, e.g., a power source voltage VDD. The inductance L4 has a first terminal serving as the second connection terminal N2 of the LC resonance tank 211, and a second terminal coupled to the first voltage. The variable capacitor C3 has a first terminal coupled to the first terminal of the inductance L3, and a second terminal receiving a reactance control signal CON. The variable capacitor C4 has a first terminal coupled to the second terminal of the variable capacitor C3, and a second terminal coupled the first terminal of the inductance L4. The LC resonance tank 211 is adapted to adjust a reactance value thereof according to the reactance control signal CON, and therefore control the oscillation frequency of the differential oscillation signal SO.

The negative resistance generator includes the switches S3 through S4. The switches S3 and S4 are implemented by N type transistors. The switch S3 has a first terminal, a second terminal, and a control terminal, respectively coupled to a second voltage, e.g., a ground voltage GND, the first and second connection terminals N1 and N2 of the LC resonance tank 211. The switch S4 has a first terminal, a second terminal, and a control terminal, respectively coupled to the second voltage, the second and first connection terminals N2 and N1 of the LC resonance tank 211.

Figure 4B:
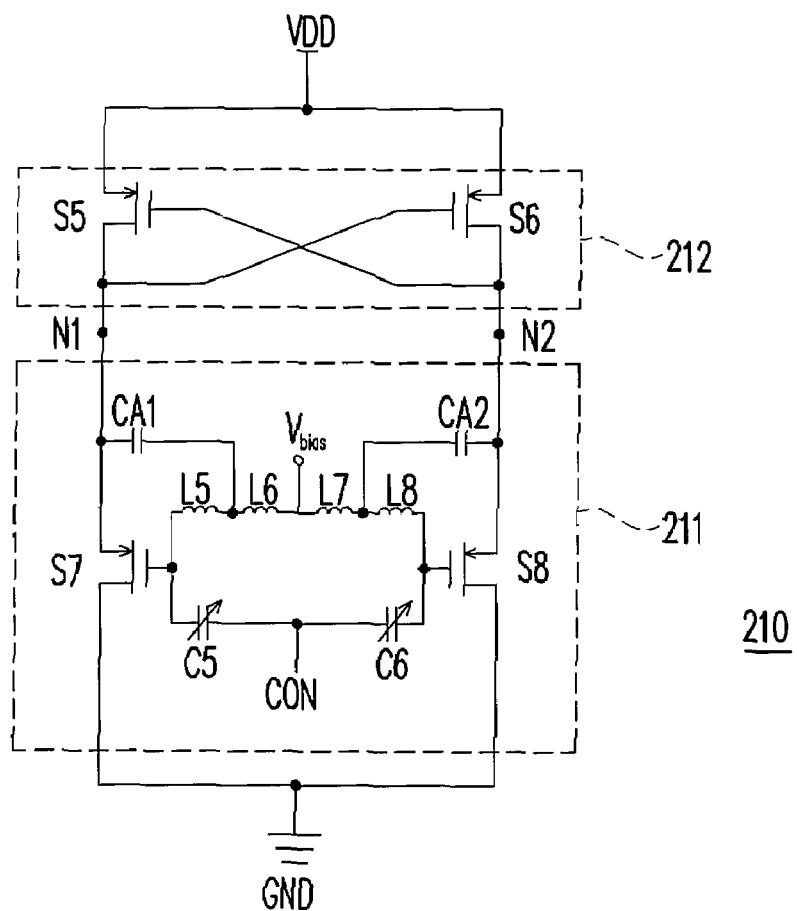
FIG. 4B is a circuit diagram illustrating a VCO of the injection-locked frequency divider of FIG. 2 according to another embodiment of the present invention.

FIG. 4B is a circuit diagram illustrating a VCO of the injection-locked frequency divider of FIG. 2 according to another embodiment of the present invention. Referring to FIG. 4B, the VCO 210 includes an LC resonance tank 211 and a negative resistance generator 212. According to an aspect of the embodiment, the VCO 210 is a Hartley VCO. Therefore, a half circuit of the injection-locked frequency divider 21 is a resonant circuit mainly composed of two inductances and one variable capacitor which are connected in parallel. The LC resonance tank 211 includes the capacitors CA1 and CA2, the inductances L5 through L8, the variable capacitors C5 and C6, and the switches S7 and S8. The switches S7 through S8 are implemented by P type transistors. The capacitor CA1 has s first terminal serving as a first connection terminal N1 of the LC resonance tank 211. The capacitor CA2 has a first terminal serving as a second connection terminal N2 of the LC resonance tank 211. The inductance L5 has a first terminal coupled to a second terminal of the capacitor CA1. The inductance L6 has a first terminal and a second terminal coupled respectively to a second terminal of the inductance L5 and a bias voltage Vbias. The inductance L7 has a first terminal and a second terminal respectively coupled to the second terminal of the inductance L6 and a second terminal of the capacitor CA2. The inductance L8 has a first terminal coupled to the second terminal of the inductance L7.

The variable capacitor C5 has a first terminal coupled to the second terminal of the inductance L5, and a second terminal receiving the reactance control signal CON. The variable capacitor C6 has a first terminal coupled to the second terminal of the variable capacitor C5, and a second terminal coupled to the second terminal of the inductance L8. The switch S7 has a first terminal, a second terminal, and a control terminal, respectively coupled to the first terminal of the capacitor CA1 and the second voltage, e.g., a ground voltage GND, and the second terminal of the inductance L5. The switch S8 has a first terminal, a second terminal, and a control terminal, respectively coupled to the first terminal of the capacitor CA2, the second voltage, and the second terminal of the inductance L8. The LC resonance tank 211 is adapted to adjust the reactance value thereof according to the reactance control signal CON, and thus controlling the oscillation frequency of the differential oscillation signal SO. Further, the negative resistance generator 212 according to the present invention is structurally and functionally similar with that shown in the embodiment of FIG. 3, and is not to be iterated hereby.

Figure 4C:
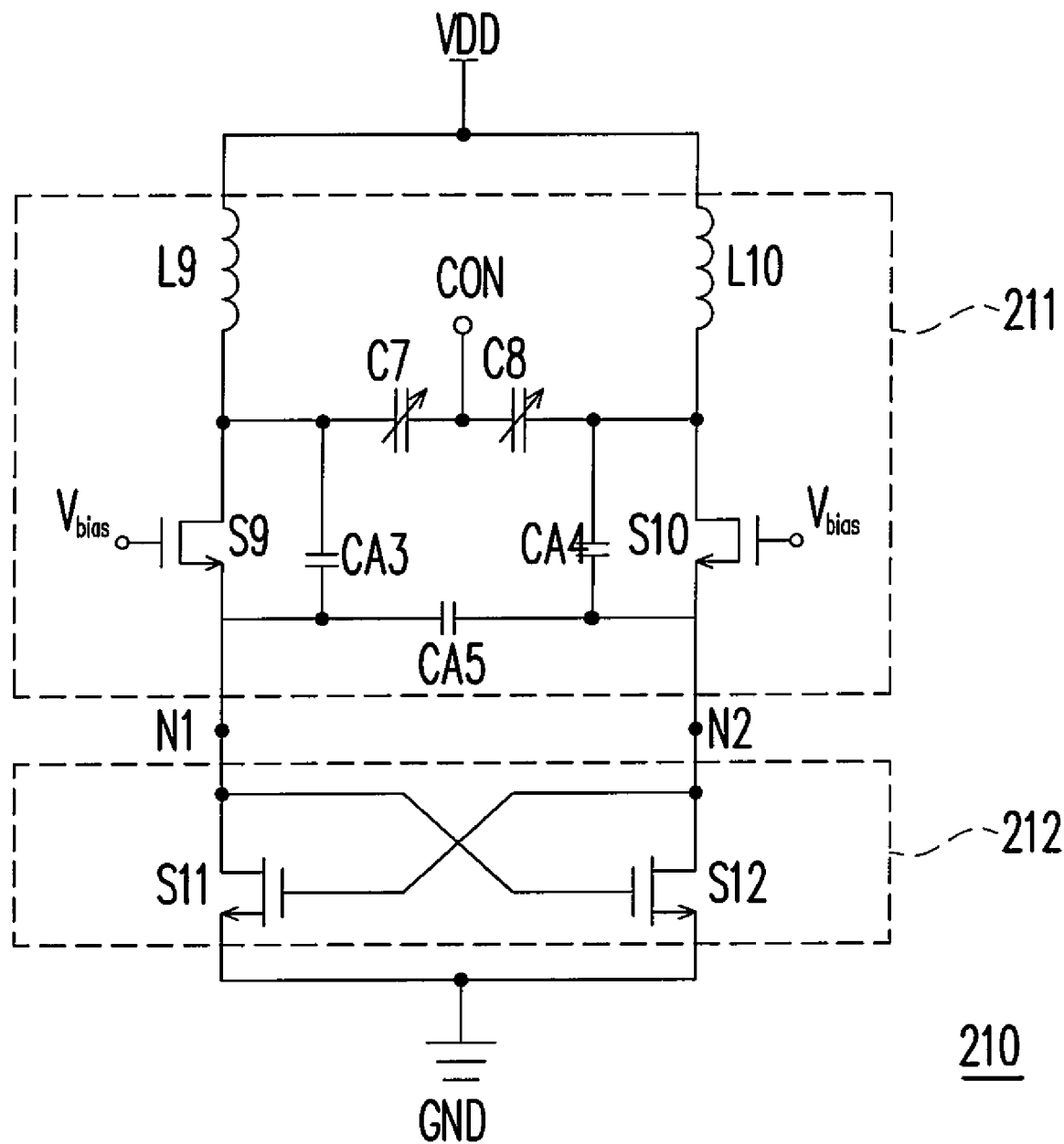
FIG. 4C is a circuit diagram illustrating a VCO of the injection-locked frequency divider of FIG. 2 according to a further embodiment of the present invention.

FIG. 4C is a circuit diagram illustrating a VCO of the injection-locked frequency divider of FIG. 2 according to another embodiment of the present invention. Referring to FIG. 4C, the VCO 210 includes an LC resonance tank 211 and a negative resistance generator 212. According to an aspect of the embodiment, the VCO 210 is a Colpitts VCO. Therefore, the LC resonance tank 211 is a resonant circuit mainly composed of an equivalent inductance and two variable capacitors. The LC resonance tank 211 includes the inductances L9 and L10, the variable capacitors C7 and C8, the capacitors CA3 through CA5, and the switches S9 and S10. The switches S9 and S10 are implemented by N type transistors. A first terminal of the inductance L9 and a first terminal of the inductance L10 are coupled to a first voltage, e.g., a power source voltage VDD. The variable capacitor C7 has a first terminal coupled to a second terminal of the inductance L9, and a second terminal receiving the reactance control signal CON. The variable capacitor C8 has a first terminal coupled to the second terminal of the variable capacitor C7, and a second terminal coupled to the second terminal of the inductance L10.

The capacitor CA3 has a first terminal coupled to the second terminal of the inductance L9, and a second terminal serving as the first connection terminal N1 of the LC resonance tank 211. The capacitor CA4 has a first terminal coupled to the second terminal of the inductance L10, and a second terminal serving as a second connection terminal N2 of the LC resonance tank 211. The capacitor CA5 has a first terminal and a second terminal respectively coupled to the second terminal of the capacitor CA3 and the second terminal of the capacitor CA4. The switch S9 has a first terminal, a second terminal, and a control terminal respectively coupled to the second terminal of the inductance L9, the second terminal of the capacitor CA3, and a bias voltage Vbias. The switch S10 has a first terminal, a second terminal, and a control terminal, respectively coupled to the second terminal of the inductance L10, the second terminal of the capacitor CA4, and the bias voltage Vbias. The LC resonance tank 211 is adapted to adjust a reactance thereof according to the reactance control signal CON, and thus controlling the oscillation frequency of the differential oscillation signal SO. Further, the negative resistance generator 212 is functionally and structurally similar with that described in the embodiment of FIG. 4A, and is not to be iterated hereby.

In summary, the injection-locked frequency divider 200 utilizes the mixer 220 to mix the differential oscillation signals SO generated by the VCO 210 with externally inputted differential injection signals SI, so as to lock an output frequency of the differential oscillation signal SO. When operating at a high frequency, a parasitic capacitance effect is generated in the mixer 220. The parasitic capacitor is adapted for filtering the high frequency signals while the low frequency signals are retained, by which the frequency is divided. In such a way, the injection-locked frequency divider 200 according to the embodiment of the present invention receiving the differential injection signal SI via the mixer 220, not only increases the locking range, but also decreases the phase noise.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An injection-locked frequency divider, comprising: a voltage control oscillator (VCO) for generating a differential oscillation signal comprising a first oscillation signal and a second oscillation signal, the VCO comprising: an LC resonance tank, comprising a first connection terminal, a second connection terminal, and a third connection terminal, the third terminal receiving a reactance control signal for adjusting a reactance of the LC resonance tank and resonating to generate the differential oscillation signal, wherein the LC resonance tank outputs the first and second oscillation signals respectively from the first and second connection terminals; and a negative resistance generator, coupled to the first and second connection terminals, for eliminating an equivalent resistance generated by the LC resonance tank and maintaining the VCO to oscillate continuously; and a mixer, coupled to the VCO, comprising a first local input terminal and a second local input terminal respectively receiving a first injection signal and a second injection signal of a differential injection signal, and a first RF input terminal and a second RF input terminal receiving the first and second oscillation signals respectively, for mixing the differential signal with the differential oscillation signal, and thus adjusting and locking an output frequency of the differential oscillation signal, wherein the LC resonance tank comprises: a first capacitor, having a first terminal serving as the first connection terminal; a second capacitor, having a first terminal serving as the second connection terminal; a first inductance, having a first terminal coupled to a second terminal of the first capacitor; a second inductance, having a first terminal coupled to the first terminal of the first inductance, and a second terminal coupled to a bias voltage; a third inductance, having a first terminal coupled to the second terminal of the second inductance, and a second terminal coupled to a second terminal of the second capacitor; a fourth inductance, having a first terminal coupled to the second terminal of the third inductance; a first variable capacitor, having a first terminal coupled to a second terminal of the first inductance, and a second terminal receiving a reactance control signal; a second variable capacitor, having a first terminal coupled to the second terminal of the first variable capacitor, and a second terminal coupled to a second terminal of the fourth inductance; a first switch, having a first terminal coupled to the first terminal of the first capacitor, a second terminal coupled to a first voltage, and a control terminal coupled to the second terminal of the first inductance; and a second switch, having a first terminal coupled to the first terminal of the second capacitor, a second terminal coupled to the first voltage, and a control terminal coupled to the second terminal of the fourth inductance, wherein the LC resonance tank adjusts a reactance value according to the reactance control signal.

2. The injection-locked frequency divider according to claim 1 further comprising a local VCO for generating the differential injection signal.

3. The injection-locked frequency divider according to claim 1 further comprising: a first buffer, coupled to the first connection terminal, for improving a signal transmission intensity of the first oscillation signal, and transmitting the first oscillation signal; and a second buffer, coupled to the second connection terminal, for improving a signal transmission intensity of the second oscillation signal, and transmitting the second oscillation signal.

4. The injection-locked frequency divider according to claim 3, wherein the first buffer and the second buffer comprise inverters.

5. The injection-locked frequency divider according to claim 1, wherein the LC resonance tank comprises:
a first inductance, having a first terminal serving as the first connection terminal;
a second inductance, having a first terminal coupled to a second terminal of the first inductance, and a second terminal serving as the second connection terminal;
a first variable capacitor, having a first terminal coupled to the first terminal of the first inductance, and a second terminal connected to the third connection terminal of the LC resonance tank for receiving the reactance control signal; and
a second variable capacitor, having a first terminal coupled to the second terminal of the first variable capacitor, and a second terminal coupled to the second terminal of the second inductance,
wherein the LC resonance tank adjusts a reactance value according to the reactance control signal.

6. The injection-locked frequency divider according to claim 1, wherein the LC resonance tank comprises:
a first inductance, having a first terminal serving as the first connection terminal, and a second terminal coupled to a first voltage;
a second inductance, having a first terminal serving as the second connection terminal, and a second terminal coupled to the first voltage;
a first variable capacitor, having a first terminal coupled to the first terminal of the first inductance, and a second terminal receiving a reactance control signal; and
a second variable capacitor, having a first terminal coupled to a second terminal of the first variable capacitor, and a second terminal coupled to the first terminal of the second inductance,
wherein the LC resonance tank adjusts a reactance value according to the reactance control signal.

7. The injection-locked frequency divider according to claim 1, wherein the LC resonance tank comprises:
a first inductance, having a first terminal coupled to a first voltage;
a second inductance, having a first terminal coupled to the first voltage;
a first variable capacitor, having a first terminal coupled to a second terminal of the first inductance, and a second terminal receiving a reactance control signal;
a second variable capacitor, having a first terminal coupled to the second terminal of the first variable capacitor, and a second terminal coupled to a second terminal of the second inductance;
a first capacitor, having a first terminal coupled to the second terminal of the first inductance, and a second terminal serving as the first connection terminal;
a second capacitor, having a first terminal coupled to the second terminal of the second inductance, and a second terminal serving as the second connection terminal;
a third capacitor, having a first terminal coupled to the second terminal of the first capacitor, and a second terminal coupled to the second terminal of the second capacitor;
a first switch, having a first terminal coupled to the second terminal of the first inductance, a second terminal coupled to the second terminal of the first capacitor, and a control terminal coupled to a bias voltage; and a second switch, having a first terminal coupled to the second terminal of the second inductance, a second terminal coupled to the second terminal of the second capacitor, and a control terminal coupled to the bias voltage, wherein the LC resonance tank adjusts a reactance value according to the reactance control signal.

8. The injection-locked frequency divider according to claim 1, wherein the negative resistance generator comprises:
   a first switch, having a first terminal coupled to a first voltage, a second terminal coupled to the first connection terminal, and a control terminal coupled to the second connection terminal; and
   a second switch, having a first terminal coupled to the first voltage, a second terminal coupled to the second connection terminal, and a control terminal coupled to the first connection terminal.

9. The injection-locked frequency divider according to claim 8, wherein the first switch and the second switch comprise P type transistors, and the first voltage comprises a power source voltage.

10. The injection-locked frequency divider according to claim 8, wherein the first switch and the second switch comprise N type transistors, and the first voltage comprises a ground voltage.

11. The injection-locked frequency divider according to claim 1, wherein the mixer comprises:
   a first transistor, having a gate receiving the first injection signal, and a first source/drain coupled to the second connection terminal;
   a second transistor, having a gate coupled to the gate of the first transistor, and a first source/drain coupled to the first connection terminal;
   a third transistor, having a gate receiving the second injection signal, a first source/drain coupled to the first connection terminal, and a second source/drain coupled to a second source/drain of the first transistor;
   a fourth transistor, having a gate coupled to the gate of the third transistor, a first source/drain coupled to the second connection terminal, and a second source/drain coupled to a second source/drain of the second transistor;
   a fifth transistor, having a gate receiving the first oscillation signal, a first source/drain coupled to the second source/drain of the first transistor, and a second source/drain coupled to a first voltage; and
   a sixth transistor, having a gate receiving the second oscillation signal, a first source/drain coupled to the second source/drain of the second transistor, and a second source/drain coupled to the first voltage,
   wherein the gate of the first transistor and the gate of the third transistor serve respectively as the first local input terminal and the second local input terminal, and the gate of the fifth transistor and the gate of the sixth transistor respectively serve as the first RF input terminal and the second RF input terminal.

12. The injection-locked frequency divider according to claim 11, wherein the first transistor through the sixth transistor comprise N type transistors, and the first voltage comprises a ground voltage.

13. The injection-locked frequency divider according to claim 11, wherein the first transistor through the sixth transistor comprise P type transistors, and the first voltage comprises a power source voltage.

14. The injection-locked frequency divider according to claim 11, wherein the mixer further comprises:
   a first resistor, having a first terminal coupled to the gate of the first transistor, and a second terminal coupled to a bias voltage; and
   a second resistor, having a first terminal coupled to the gate of the third transistor, and a second terminal coupled to the bias voltage.

15. The injection-locked frequency divider according to claim 1, wherein the mixer comprises a Gilbert cell mixer.

16. The injection-locked frequency divider according to claim 1, wherein an output frequency of the differential oscillation signal is a half of a frequency of the differential injection signal.

* * * * *